United States Patent [19]

Chlipala

[11] Patent Number: 5,021,362
[45] Date of Patent: Jun. 4, 1991

[54] LASER LINK BLOWING IN INTEGRATEED CIRCUIT FABRICATION

[75] Inventor: James D. Chlipala, Lower Macungie Township, Lehigh County, Pa.

[73] Assignee: AT&T Bell Laboratories, Murray Hill, N.J.

[21] Appl. No.: 459,168

[22] Filed: Dec. 29, 1989

[51] Int. Cl.[5] .................. H01L 21/268; H01L 21/00
[52] U.S. Cl. ..................................... 437/173; 437/7; 437/935; 437/936
[58] Field of Search .................. 437/173, 935, 936, 7, 437/8

[56] References Cited

U.S. PATENT DOCUMENTS

| 4,720,620 | 1/1988 | Arima | 219/121.72 |
| 4,816,422 | 3/1989 | Yerman et al. | 437/935 |
| 4,853,758 | 8/1989 | Fischer . | |
| 4,902,631 | 2/1990 | Downey et al. | 437/7 |

FOREIGN PATENT DOCUMENTS

| 241562 | 12/1986 | Fed. Rep. of Germany | 219/121.72 |
| 17078 | 2/1978 | Japan | 437/7 |

OTHER PUBLICATIONS

Applied Physics Letters, vol. 5, No. 3, "Switching of Semi-conductor Reflectivity by a Giant Pulse Laser", pp. 54–56; Aug. 1, 1964; W. R. Sooy et al.

Journal of Applied Physics, vol. 39, No. 13, "Reflectivity Enhancement of Semiconductors by O-Switched Ruby Lasers", pp. 6032–6036, Dec. 1968; M. Birnbaum et al.

Applied Physics Letters, vol. 34, No. 6, "A transient Optical Reflectivity Study of Laser Annealing of Ion-Implanted Silicon: Thresholds and Kinetics", pp. 363–365, Mar. 15, 1979; Y. S. Liu et al.

Primary Examiner—Brian E. Hearn
Assistant Examiner—Linda J. Fleck
Attorney, Agent, or Firm—Richard D. Laumann

[57] ABSTRACT

A single beam of radiation is split and part of the beam is directed to conductive links, e.g. runners on a substrate. Analysis of the incident beam and the beam reflected from the substrate permits a determination of when the link is blown and rendered non-conductive and when significant substrate involvement occurs.

6 Claims, 4 Drawing Sheets

LASER LINK BLOWING IN INTEGRATEED CIRCUIT FABRICATION

TECHNICAL FIELD

This invention relates to a method of fabricating integrated circuits which includes fabricating features by the application of radiation.

BACKGROUND OF THE INVENTION

Since their invention, integrated circuits have incrased greatly in complexity and today have many more components than they had initially. As the number of components in the circuits continues to increase and the dimension of the individual components of the circuits continue to decrease in size, it becomes increasingly difficult to fabricate integrated circuit chips with every component having satisfactory characteristics. That is, as is well known, a plurality of chips are fabricated on a single wafer, and each chip has an integrated circuit with numerous individual components. However, any individual integrated circuit may have one or more defective components which render the entire integrated circuit commerically useless. Therefore, the yield of useful chips per wafer will decrease as the number of defective components increase, and this is obviously undesirable because a low yield increases the cost of an integrated circuit.

Therefore, techniques have been sought which increase the yield of integratecd circuits. One technique increases the yield by both refining and better controlling the processing techniques. Another technique includes redundant components on the chip. The redundant components are either systematically included or excluded in the integrated circuit as defective components are found. The redundant components are typically included or excluded from the integrated circuit by completing or breaking an electrical circuit and thus repairing the circuit. This repair is frequently done by using radiation, e.g. electromagnetic energy, to break a conductive link. The link is simply a conductive, e.g. aluminum or polysilicon, line or runner on a substrate. The energy is typically supplied by a laser in amounts sufficient to melt or vaporize the desired portion of the link. The repair process, to be successful in a complex circuit, might involve the repair of hundreds of links. While repair is generally practiced only for complex circuits, simpler circuits often have their fabrication completed by selective inclusion or exclusion of individual components to yield a custom integrated circuit. This may involve tens of thousands of links. For both repair and customization, it is desirable that the breaking of the links be done consistently.

Although conceptually simple, the use of a laser to break links encounters difficulties in practice thus making its use more difficult than might be thought initially. The amount of energy used must be sufficient to consistently destroy the links, but it must also be less than the amount of energy which would damage either the underlying or surrounding material. There is thus a range of allowable energies. Remaining within this range is complicated by variations in the physical characteristics of the link structure as well as variations in the output energy of the laser and the targeting accuracy of the laser.

Techniques have been developed to study the effects of laser radiation on metal and semiconductor surfaces. Perhaps the first technique developed studied the temporal change in intensity of light reflected from the surface during irradiation. Such a technique is called time resolved reflectivity and has been used since Sooy et al. published an article in *Applied Physics Letters,* 5, pp. 54–56, Aug. 1, 1964. Sooy was interested in using a semiconductor as a Q switch, and the reflectivity from a semiconductor surface determined its utility as a cavity mirror. Sooy attributed the time dependence of the reflectivity as being due to increased carrier concentration and melting of the semiconductor surface caused by the radiation. Birnbaum and Stocker reported the reflectivity of semiconductors in *Journal of Applied Physics,* 39, pp. 6032–6036, December 1968. They found an enhanced reflectivity from semiconductor surfaces which they attributed to a liquid layer, formed by semiconductor melting, on the surface having matallic properties. They also studied reflectivity from several metals and found a decrease in reflectivity which they attributed to damage on the metal surface.

Both of these studies used a two laser experimental arrangement in which one laser acted as the pump and the other laser acted as the probe. That is, one laser, i.e., pump, produced a response in the target material, and the production of this response was monitored by measuring the intensity of the reflected beam from the other, i.e., probe, laser. Two beam techniques are difficult to implement for link blowing because the probe beam and the pump beam must overlap; this is difficult to accomplish due to the small beam and feature sizes.

A single laser study of ion-implanted silicon was reported by Liu et al. in *Applied Physics Letters,* 34, pp. 363–365, Mar. 15, 1979. The precise experimental setup is not described in detail, but the article states that the samples were irradiated at approximately normal incidence, and that both the incident and reflected pulses were detected separately with photodiodes. It was found that, as the incident energy increased, the melting onset for an amorphous to liquid transition moved to an earlier part of the pulse, i.e., the transition occurred earlier in time. The authors also found an enhanced reflectivity which was sttributed to the presence of melted silicon. While the study was interesting technically, Liu et al. was interested in studying the laser annealing of ion implanted silicon; e.e., the liquid phase epitaxial regrowth of silicon after melting, and the study did not discuss laser irradiation of multilevel structures such as those present when links are broken. None of the studies discussed examined any phenomena comparable to link explosion.

There are teachings in the literature of techniques useful in link blowing. For example, U.S. Pat. No. 4,853,758, issued on Aug. 1, 1989, to Frederick S. Fisher describes an exemplary technique for using a laser to blow links with a wide range of acceptable energies. In an exemplary embodiment, the technique places links on upper levels on dielectric pedestal whereby the links on lower levels have the thickness of the overlying dielectric reduced. The reduced dielectric thickness reduces the minimum laser energy required to cleanly blow the links on both levels.

However, it would be desirable to have a process that incorporates temporal monitoring of the link blowin process.

SUMMARY OF THE INVENTION

A method of integrated circuit manufacture in which portions of the circuit are rendered nonconductive by the application of incident radiation, a method comprising illuminating said portions of the integrated circuit which are desired to be nonconductive with a beam of radiation, the portions comprising a conductive material on a non-conductive substrate; and analyzing the incident and reflected energy intensities to determine whether the portions were rendered nonconductive. In a preferred embodiment, the method comprises the further step of comparing the incident reflected energy intensities to determine the extent of substrate involvement. In another preferred embodiment, if a link did not blow, the analysis of the beam intensities permits a determination of whether the failure was because of a targeting error, contamination or low incident energy. The radiation source is typically a laser, and its output energy many be increased if the link was not broken, for reasons other than targeting errors or contamination, or decreased if significant substrate involvement occured.

For reasons of clarity, the individual elements are not drawn to scale.

DETAILED DESCRIPTION

Figure 1:
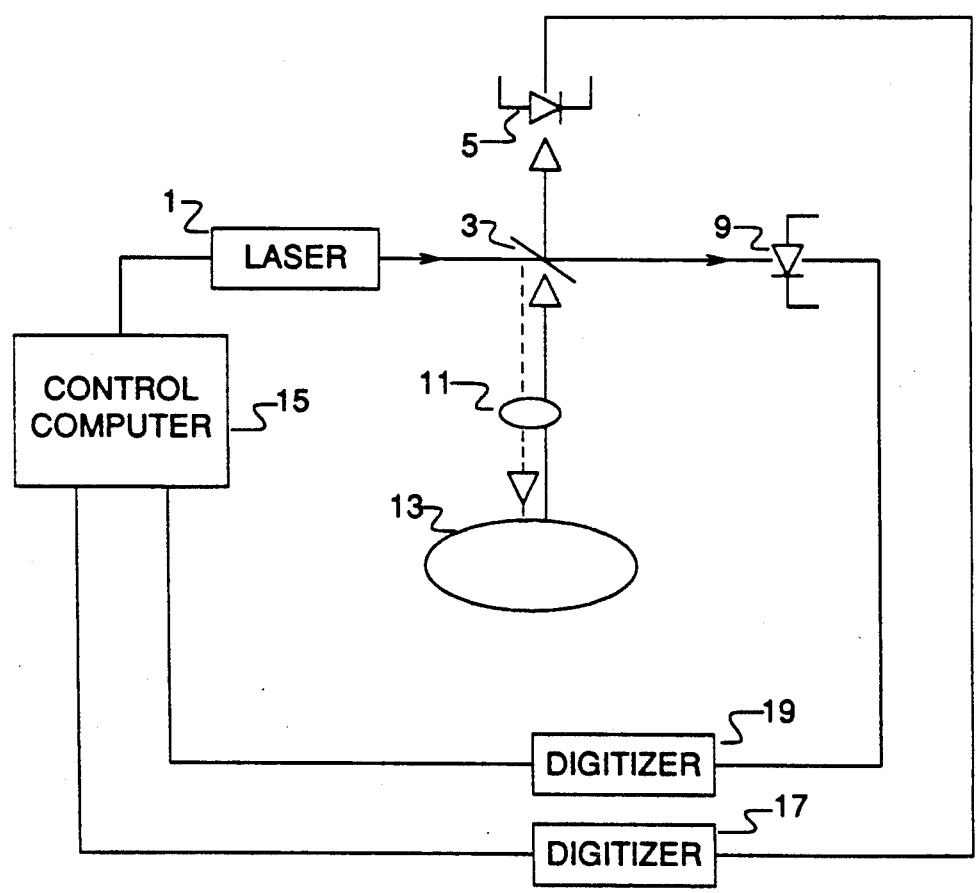
FIG. 1 is a schematic representation of apparatus suitable for practicing the method of this invention.

FIG. 1 is a schematic representation of apparatus useful in practicing the method of this invention. The element of the apparatus depicted are represented schematically for reasons of clarity. Depicted are laser 1, which is the source of radiation; beam splitter 3; photodetector 5 which detects the reflected radiation; photodetector 9 which detects the incident radiation; lens 11; substrate 13; and control computer 15. Connected to photodetectors 5 and 9 are digitizers 17 and 19, respectively, whose electrical outputs go to the laser control computer. The radiation goes from the laser to the beam splitter where a portion goes directly to photodetector 9 which detects the incident beam, while another portion of the beam goes to the substrate and is reflected back from the substrate through the beam splitter to photodetector 5 which detects the reflected radiation.

The precise digitization rate is not critical, but the rate must be sufficiently high so that rapid temporal phenomena can be detected. For the embodiment that will be described subsequently, a period of 1ns worked satisfactorily. Those skilled in the art will readily select a suitable rate.

The elements depicted are well known to those skilled in the art, and such persons will readily select appropriate elements. Several brief comments about the elements are believed desirable. The photodetectors must have a response time adequate for the short duration, typically 5ns, change in reflectivity when the link is destroyed. The laser should have an emission wavelength such that the emitted radiation is absorbed or reflected by the link and also be capable of a high repetition rate. A Nd:YAG laser emitting at 1.064 $\mu$m can be used directly. Alternatively, the laser can be used when a frequency doubler. For reasonable throughput, i.e., number of links broken per second, the laser should be able to produce at least 20 pulses per second. The pulses used had a full width at half maximum (fwhm) of 35 ns. The lens 11 reduces the beam to an appropriate size. The beam should have a diameter comparable to the transverse dimension of the link. The beam shape is not, however, critical. Techniques for moving the beam to the desired locations will be readily selected and implemented by those skilled in the art. Link locations are entered into, and stored in, the computer memory. The initial beam alignment uses techniques well known to those skilled in the art.

The laser control computer controls the energy of the laser pulses and also performs other necessary fuctions. For reasons of clarity, only a single computer is depicted. Of course, the necessary computer functions may be divided between several computers, if desired. The electrical outputs from the two photodetectors are fed into the digitizers, and the information from the digitizers goes to the computer which performs all the necessary manipulation of the digitized information. For example, it calculates the first derivative of the reflected and incident pulse intensities, the second derivative of the reflected intensity, and the perturbed reflectivity, etc. The perturbed reflectivity and its usefulness will be described in more detail later. The unperturbed reflected pulse intensity is the reflected pulse intensity expected had there been no thermal effects in the link or substrate. Essentially, the perturbed reflectivity is the actual reflected pulse intensity divided by the unperturbed reflected pulse intensity with the division being made on a point-by-point basis; i.e., the peak intensities of the actual reflected pulse and the unperturbed reflected pulse are determined, and the two pulses are divided on a temporal point-by-point basis with the two peak intensities coinciding. The control computer can also use the information about the incident radiation intensity to maintain the laser output intensity at a desired level.

It can also use the pulse intensity information to check targeting accuracy, dust on the links. laser output energy etc. If the energy is below threshold for blowing the link, the output from the laser has probably drifted below the desired value and is increased to the desired value. If the energy is above threshold and the link did not blow, there was a targeting error or contamination on the link. Those skilled in the art will be able to distinguish these possibilities by comparison of the actual reflected energy with that expected for contamination or targeting errors. These situations will have different thermal reponses.

Figure 2:
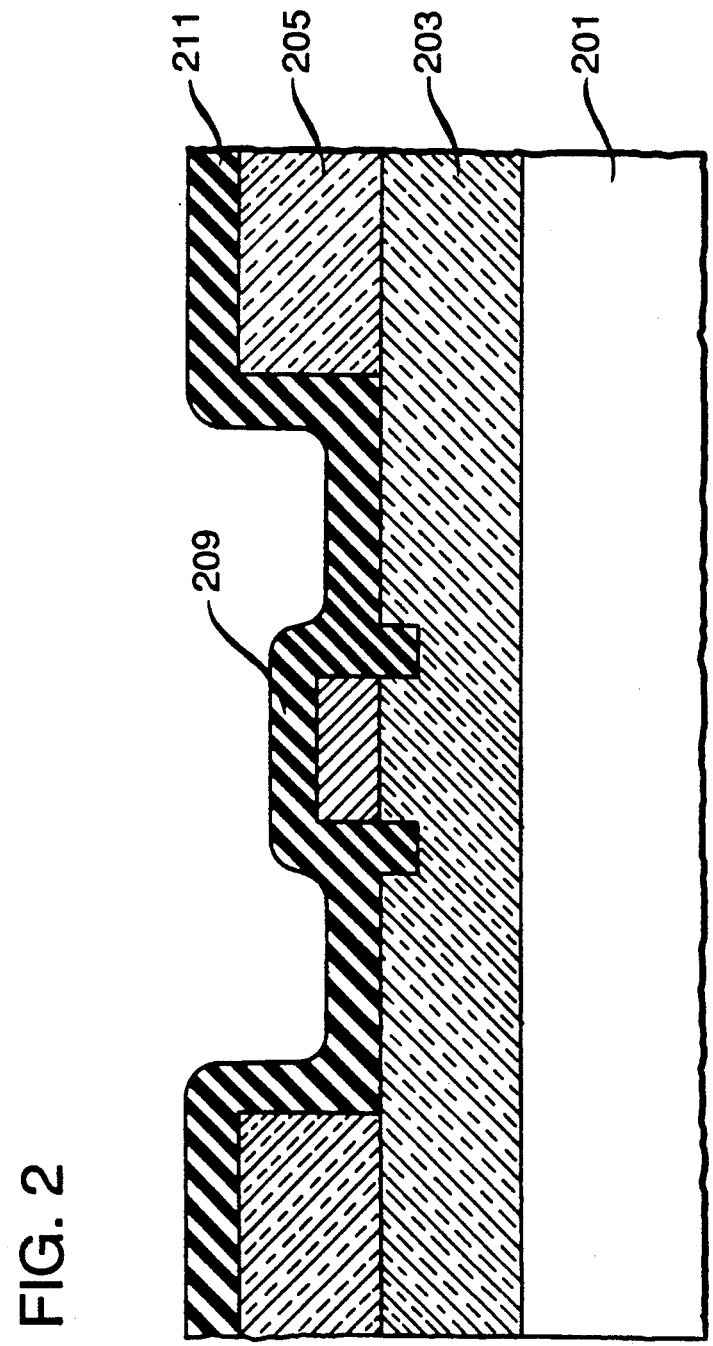
FIG. 2 is a schematic representation of a portion of an integrated circuit fabricated according to the method of this invention.

A schematic representation of a portion of an integrate circuit is depicted in FIG. 2. Depicted are: substrate 201 first and second dielectric layers 203 and 205, respectively; runner 209 and cap layer 211. The individual elements, e.g. source, gate and drain, of the devices are not depticted for reasons of clarity but are well known to those skilled in the art. The dielectric layers will typically be oxide or nitride materials. Methods for fabricating such layers are well known to those skilled in the art and need not be described. The runners comprise a conducting material, such as doped polysilicon, aluminum, a silicide, or tungsten. A portion of runner 209 will be blown by the method of this invention; a portion of runner 209 will be rendered non-conductive. As can be seen, the dielectric material surrounding it has been removed, and it is on a dielectric pedestal. A thin cap layer of non-conducting material, e.g. oxide, was deposited on the surface after pedestal formation was completed. Some conducting runner material is vaporized and inevitably splatters when the link is blown. The persence of the cap layer prevents shorts between runners caused by the splattering.

Qualitatively, with A1 links, it is expected that as the pulse energy increases the reflectivity will decrease even if the illuminated melt. The reflectivity did initially decrease. A portion of the decrease is attributed to a necking down of the transverse dimension of the link due to surface tension as the runner melt. When the target link blows, there is a clear signal in the reflected intensity, i.e., a rapid decrease. If the energy is further increased, a second peak in the reflected intensity is seen which is attributed to significant substrate involvement, i.e., heating. The method thus permits detection of whether the link did or did not blow and, if it did, whether significant substrate involvement occured. Significant substrate involvement means that substrate characteristics could be adversely affected by the radiation.

Figure 3:
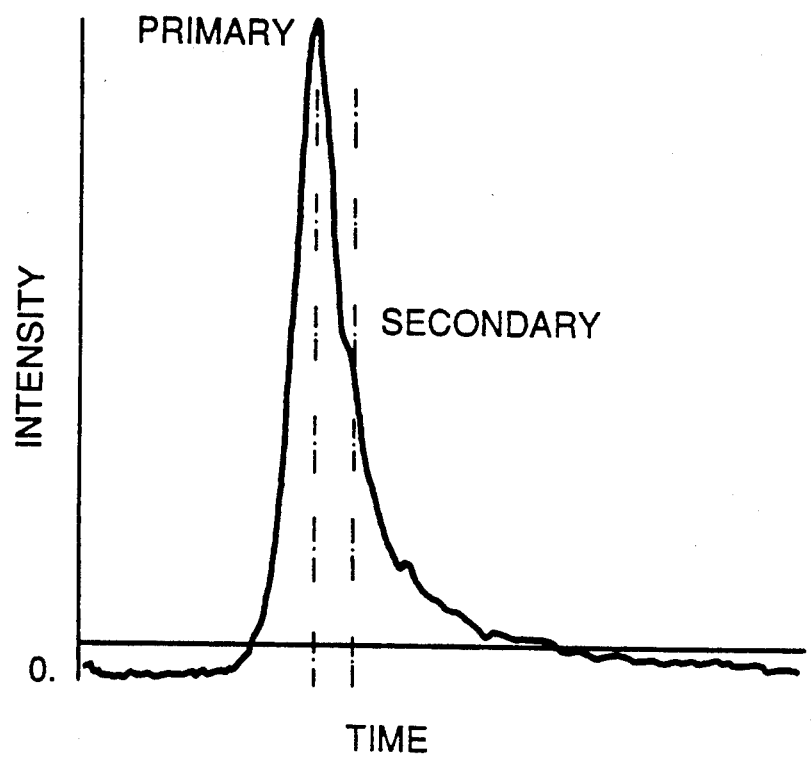
FIG. 3 plot the reflected energy intensity vertically in arbitrary units versus time horizontally in arbitrary units.

The above comments are illustrated by consideration of the following. FIG. 3 plots the intensity of the reflected beam vertically in arbitrary units versus the time horizontally also is arbitrary units. The structure was similar to that depicted in FIG. 2 although the cap layer was absent. The laser used was a Nd:YAG laser emitting at 1.064 $\mu$m with an intensity of 0.80 $\mu$mJ. the duration of the pulse was approximately 200 ns. The link comprised A1 runners 1.75 $\mu$m thick and 0.5 $\mu$m high on a silicon substrate. The highest energy used without a link blowing was 0.70 $\mu$J at at 0.75 $\mu$J the link was destroyed. As can be seen, there is some structure in the pulse and the dashed lines indicate a primary peak and a secondary peak, with the latter peak being later in time than the former peak. As soon as the link disappears, the substrate becomes thermally involved and the reflectivity changes. The term "peak" is used for reasons of convenience and is somewhat of a misnomer at this energy because, as is evident, the secondary peak is really a shoulder.

Figure 4:
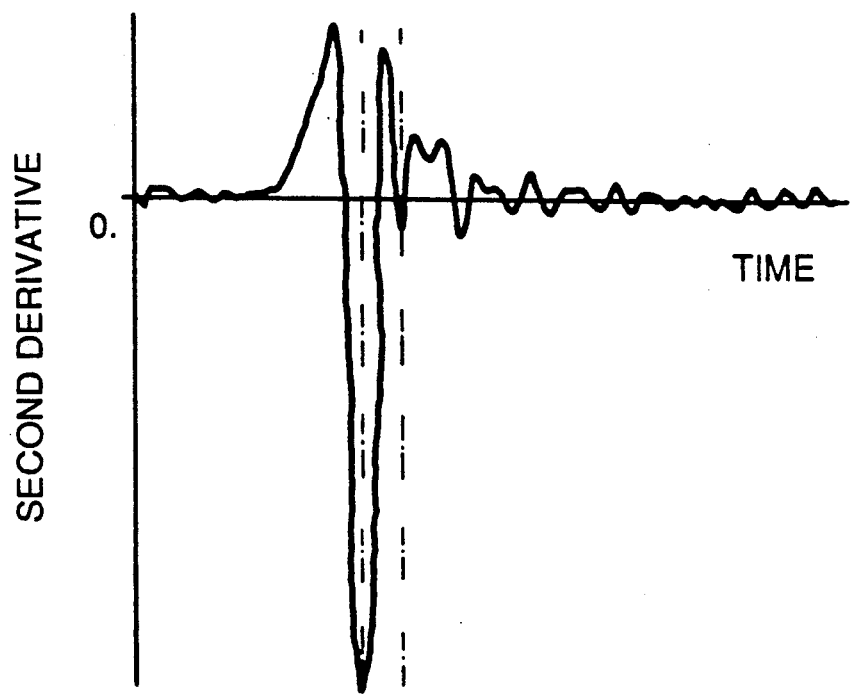
FIG. 4 plots the second derivative of the reflected intensity vertically versus time horizontally.

The determination of whether a link has blown is made by analyzing the incident and reflected intensities. An exemplary technique which examines the second derivative of the reflected intensity will be examined. Other techniques may, of course, be used. The derivatives are calculated mumerically. A temporal window is defined, and events of interest are sought within the window. The window is conveniently defined as beginning when the pulse intensity first reaches 10 percent of the measured maximum and ending at some defined time interval, e.g. 30 ns, after the maximum pulse intensity. The structure of FIG. 3 becomes more evident when the second derivative is examined. FIG. 4 plots the second derivative vertically in arbitrary units. The dotted lines indicate the times at which the primary and the secondary peaks occur in FIG. 3. There are three zero crossings after the primary peak in FIG. 4; i.e., the second derivative changes from + to −, or vice versa, three times after the primary peak and within the window (not indicated). All subsequent references to zero crossings are to zero crossings after the primary peak and within the window. If there are three zero crossing within the window, the link will have vanished. It is believed that the changes can be explained as follows. The reflectivity initially decreases after the primary peak because of the pulse shape and link absorption. The first derivative reaches a minimum negative value and then increases to zero as the pulse ends. If there is an increase in reflection, corresponding to substrate reflection, there will be a local maximum in the first derivative of the reflected pulse. The local maximum in the reflected intensity within the window is easily found by counting the zero crossing of the second derivative. It may also be found by examination of the first derivative. In FIG. 4, there is a local minimum between the second and third zero crossings, and this evidence of increased substrate reflection indicates that the link has vanished. There is a considerable amount of noise present in reflected intensity, and there is also a considerable amount of noise present in the second derivative. However, the choice of the window excludes most of the noise and there is an acceptable signal to noise ratio within the window.

The presence of a local minimum between the second and third zero crossing enables the determination to be made that the link has been broken. However, this information above does not by itself enable a suitable range of energies to be selected. The additional information needed is obtained by performing a series of runs with gradually increasing energies; eventually, the link is broken and the minimum amount of energy needed to bread the link is determined. However, due to variations in the characteristics of individual links, contamination, pulse energy, and targeting errors, an energy greater than the minimum is desirably used. The energy should not be sufficiently great that the substrate is destructively involved; i.e., the energy should not be sufficiently great that there is an adverse, permanent change in the characteristics of the substrate. The energy used should be sufficient to break the links with consistency but not so great that there is adverse, permanent substrate involvement.

Significant substrate involvement is determined by looking at what is termed "the perturbed reflectivity." An energy is selected which is too low to produce significant thermal effects, e.g. meltling, in the link but high enough to have a good signal to noise ration. Baseline levels are calculated, and both the incident and reflected curves are put on their baseline level. The baseline level is desirably calculated using a moving average to minimize the effects of noise. After aligning the two peaks, the reflected scan is divided by the incident scan on a point by point basis to produce the unperturbed reflected pulse, i.e., the unperturbed reflected pulse transformation array. Since the laser energy was selected too low for the production of significant thermal effects, the point by point multiplication of this array by the digitized incident pulse reproduces the pulse reflected from the target link which exhibits no significant thermal effects.

Figure 5:
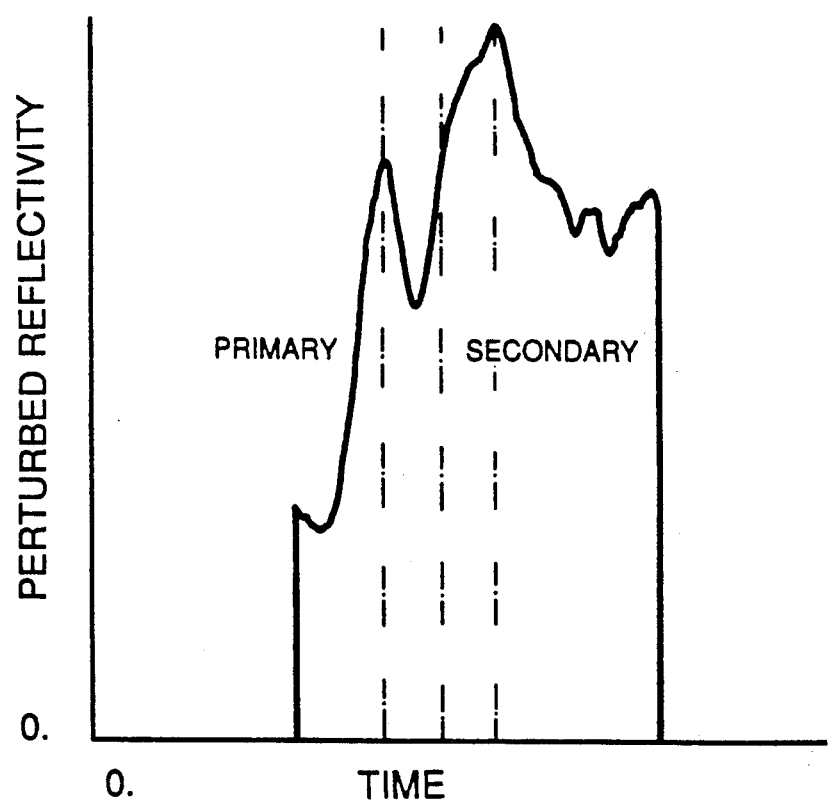
FIG. 5 plots the perturbed reflectivity vertically in arbitrary units versus time horizontally.

For higher incident laser energies, at which there may or may not be significant thermal effects in the traget link, the digitized incident pulse is multiplied point by point by this array to produce the unperturbed reflected pulse. Therefore, the unperturbed reflected pulse represents the reflected pulse expected were there no significant thermal effects at the energy. the actual reflected pulse differs from the unperturbed reflected pulse due to the presence of thermal effects. The measured reflected pulse is now divided on a point-by-point basis by the unperturbed reflected pulse to determine the perturbed reflectivity. The perturbed reflectivity may now be identified with the presence of thermal effects. A graph of the perturbed reflectivity at an incident energy of 1.10 μJ is depicted in FIG. 5 with the perturbed relfectivity plotted vertically versus the time horizontally in arbitrary units. The perturbed reflectivity has a primary peak at the same time as does the unperturbed reflectivity. As the incident energy increases from the level at which the links are blown, a second peak occuring after the primary or first peak becomes evident. If the amplitude of the second peak matches or approaches that of the primary peak, there will be observable substrate damage. In the perturbed reflectivity curve depicted, the amplitude of the second peak exceeds that of the primary peak, and there was observable substrate damage. Thus, the incident energy should be selected such that the amount of substrate involvement is at, or below, an allowable level. This may be conveniently done by monitoring the relative amplitudes of the two peaks. Those skilled in the art will readily select such an energy. Of course, this energy may be well below the level for observable substrate damage, i.e., the second peack may be much smaller than the primary peak.

Still other variations will be readily apparent to those skilled in the art. For example, the links may comprise polysilicon, or a silicide, rather than a metal. The analysis of the intensities may differ for other materials as compared with aluminum. However, those skilled in the art will readily work out the details. Additionally, although a laser is the preferred source of radiation, other radiation sources are possible. Furthermoe, the cap layer or pedestal depicted in FIG. 2 may be ommitted if desired.

I claim:

1. A method of integrated circuit manufacture in which portions of the circuit are rendered non-conductive by the application of incident radiation energy, said method comprising the steps of:

Illuminating said portions of said integrated circuit which are desired to be rendered non-conductive with a beam of radiation, said portions comprising an electrically conducting material on a non-conducting substrate; and, analyzing the incident and reflected radiation intensities to determine if said portions were redered non conductive, and increasing the output of said laser if said portions were not rendered non-conductive or decreasing the output of said laser if significant substrate involvement occurred.

2. A method as recited in claim 1 in which the source of rediation comprises a laser.

3. A method as recited in claim 2 comprising further step of comparing said incident and reflected energy intensities to determine if significant substrate involvement occurred.

4. A method as recited in claim 3 in which said comparing step uses the perturded reflectivity.

5. A method as recited in claim 1 in which said analyzing step uses a derivative of at least one of said incident and reflected beam intensities.

6. A method as recited in claim 3 comprising the further step of monitoring the incident pulse energy and determining if it is above or below threshold for link blowing.

* * * * *